(12) United States Patent
Olson (10) Patent No.: US 10,873,290 B2
(45) Date of Patent: Dec. 22, 2020

(54) LEAK RESISTANT SOLAR PANEL INSTALLATION CLAMP AND METHOD OF USE

(71) Applicant: BLUE LIGHTNING LLC, Boise, ID (US)

(72) Inventor: Greg J. Olson, Boise, ID (US)

(*) Notice: Subject to any disclaimer, the term of this patent is extended or adjusted under 35 U.S.C. 154(b) by 0 days.

(21) Appl. No.: 16/375,759

(22) Filed: Apr. 4, 2019

(65) Prior Publication Data
US 2019/0372515 A1 Dec. 5, 2019

Related U.S. Application Data (60) Provisional application No. 62/652,817, filed on Apr. 4, 2018.

(51) Int. Cl.
| | | |
|---|---|---|
| *H01L 31/044* | (2014.01) | |
| *H02S 30/00* | (2014.01) | |
| *F16B 5/06* | (2006.01) | |
| *H01L 31/00* | (2006.01) | |

(52) U.S. Cl.
CPC ............ *H02S 30/00* (2013.01); *F16B 5/0621* (2013.01); *H01L 31/00* (2013.01)

(58) Field of Classification Search
CPC ....... H01L 31/00–078; Y02E 10/50–60; H02S 10/00–40; H02S 20/00–32; H02S 30/00–20; H02S 40/00–44; H02S 50/00–15
USPC ................................................ 136/243–265
See application file for complete search history.

(56) References Cited

U.S. PATENT DOCUMENTS

| | | | |
|---|---|---|---|
| 7,748,175 B2 | 7/2010 | Liebendorfer | |
| 8,176,693 B2 | 5/2012 | Abott | |
| 8,256,169 B2 | 9/2012 | Cusson | |
| 8,413,944 B2 | 4/2013 | Harberts et al. | |
| 8,776,454 B2 | 7/2014 | Zuritis | |
| 9,080,792 B2 | 7/2015 | Patton | |
| 9,160,273 B2 | 10/2015 | Schuit | |
| 9,299,868 B2 | 3/2016 | Thomas | |
| 9,303,663 B2 | 4/2016 | Greenamyer | |
| 9,584,062 B2 * | 2/2017 | Ganshaw | F24S 25/634 |
| 10,256,766 B2 * | 4/2019 | Thomas | F24S 25/33 |
| 10,340,837 B2 * | 7/2019 | Wildes | F24S 25/636 |
| 2009/0250580 A1 | 10/2009 | Strizki | |
| 2011/0100434 A1 | 5/2011 | Van Walraven | |
| 2011/0203637 A1 | 8/2011 | Patton | |
| 2011/0214365 A1 | 9/2011 | Aftanas | |
| 2012/0152326 A1 | 6/2012 | West | |

(Continued)

*Primary Examiner* — Bach T Dinh
(74) *Attorney, Agent, or Firm* — Scott D. Swanson; Shaver & Swanson, LLP (57) ABSTRACT

What is disclosed is a mounting system for one or more solar panels for use, for example, on a roof, awning, parking structure, or other location. The mounting system preferably utilizes one or more generally u shaped tracks. The U shaped tracks are configured for insertion of an I-beam. The I beam is configured to extend beyond the end of the arms of the u-shaped tracks such that an edge of a solar panel can be positioned between an arm of the I beam and the end of the arm of the U shaped track. A tightening mechanism is utilized to provide tension on the I beam toward the bottom of the u shaped track to retain the solar panel between the arm of the I beam and the arm of the U shaped track.

5 Claims, 11 Drawing Sheets

(56) References Cited

U.S. PATENT DOCUMENTS

2015/0288320 A1* 10/2015 Stearns .................. F24S 25/40
52/173.3

* cited by examiner

LEAK RESISTANT SOLAR PANEL INSTALLATION CLAMP AND METHOD OF USE

STATEMENT IN COMPLIANCE WITH 37 CFR 1.71(d)

A portion of the disclosure of this patent document contains material which is subject to (copyright or mask work) protection. The (copyright or mask work) owner has no objection to the facsimile reproduction by anyone of the patent document or the patent disclosure, as it appears in the Patent and Trademark Office patent file or records, but otherwise reserves all (copyright or mask work) rights whatsoever.

SUMMARY OF THE DISCLOSURE

Disclosed is a leak resistant solar panel installation that uses an I-beam partially nested within a channel formed by a rail. The solar panel is placed between the top of the beam and the edge of the channel opening. An adjustable clamp extends from the underside of the rail through the interior of the channel, where it embraces the foot of the I-beam. By manipulating the clamp, the beam is drawn further into the channel, pinching or holding the panel between the I-beam and the rail, securing it in place. The points of contact between the solar panel and beam and rail include protective and leak resistant fittings. Additional watertight applications may be used to create a leak-proof assembly.

Still other features and advantages of the presently disclosed and claimed inventive concept(s) will become readily apparent to those skilled in this art from the following detailed description describing preferred embodiments of the inventive concept(s), simply by way of illustration of the best mode contemplated by carrying out the inventive concept(s). As will be realized, the inventive concept(s) is capable of modification in various obvious respects all without departing from the inventive concept(s). Accordingly, the drawings and description of the preferred embodiments are to be regarded as illustrative in nature, and not as restrictive in nature.

DETAILED DESCRIPTION

Figure 1:
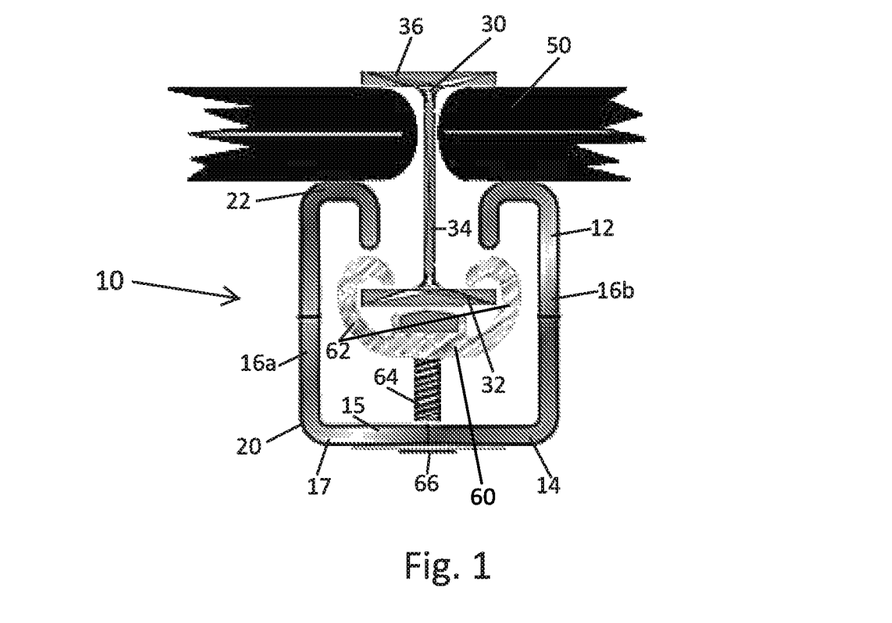
FIG. 1 depicts a cross-section of an embodiment of the solar panel assembly with a mounted solar panel.

A leak resistant solar panel assembly can be used to securely mount solar panels while minimizing leakage of fluid between the solar panels and the assembly hardware. FIG. 1 is a cross-section of the solar panel assembly with a mounted solar panel. As shown in FIG. 1, the assembly 10 includes a rail 12 with a base 14 and two walls 16a, 16b. The base 14 has a first side 15, a second side 17, and holes 19 connecting the first side 15 and the second side 17.

Each of the walls 16a, 16b has a base edge 20 and a free edge 22. The walls 16a, 16b are attached to the first side 15 of the base 14 at each base edge 20. Each of the walls 16a, 16b extends away from the first side 15 of the base 14 such that the walls 16a, 16b oppose each other to form a channel, with the space between the free edges 22 defining an opening into the channel.

FIG. 1 also shows an I-beam 30 having a foot 32, a spine 34, and a head 36. The foot 32 and head 36 are each a flat, elongated member, and are positioned parallel to each other and joined by perpendicular attachment of the spine 34. The I-beam is positioned within the rail 12 such that the foot 32 is situated within the channel and the spine 34 extends through the channel opening with the head 36 outside of the channel. The relative position of the head 36 and free edges 22 on either side of the spine 34 defines a gap 40 between the free edges 22 and the head 36. The gap 40 is capable of accommodating the thickness of a solar panel 50. In FIG. 1, a solar panel 50 is inserted into the gap 40.

Also shown in FIG. 1 is one of a plurality of clamps. In a preferred embodiment each clamp 60 has a pair of retaining flanges 62, a coupler 64, and an adjuster 66. In alternative embodiments, the coupler 64 and the adjuster 66 can link directly to the clamp 60 without the need for a pair of retaining flanges. As shown in FIG. 1, the pair of retaining flanges 62 is positioned inside the channel and configured to clasp the foot 32. The coupler 64 is attached to the pair of retaining flanges 62 and extends through one of the holes 19 in the base 14. The adjuster 66 is attached to the coupler 64 and is located and accessible from the underside of the rail, outside the channel. The clamp 60 is configured such that manipulation of the adjuster 66 changes the distance between the pair of retaining flanges 62 and the adjuster 66.

When the edge of a solar panel 50 is inserted into the gap 40, the adjuster 66 may be manipulated so as to shorten the distance between the adjuster 66 and the pair of retaining flanges 62, thereby pulling the I-beam 30 further into the channel of the rail 12 and reducing the size of the gap 40 until the solar panel is securely held between a free edge 22 and the head 36.

Different clamp configurations may be employed. In one embodiment, shown in FIG. 1, the pair of retaining flanges 62 is curved to clasp the foot 32 and contains an aperture near its center. The coupler 64 is a bolt inserted through the pair of retaining flanges aperture and anchored into a lock nut nested in, or optionally integrated into, the pair of retaining flanges 62. The adjuster 66 is an integrated head of the bolt, which is contoured to allow turning of the bolt. By turning the adjuster 66, the bolt turns and, because it is interfaced with the lock nut on the other side of the pair of retaining flanges 62, the pair of retaining flanges 62 is pulled deeper into the channel, bringing the I-beam 30 with it.

Because the solar panel is secured by tightening the clamp 30 and thereby narrowing the gap 40 between the solar panel 50 and the head 36, pressure is exerted on the edge of the solar panel 50 during installation. Thus, it may be useful to insert a protective layer, such as a foam cushion, rubber, etc., between the free edge 22 and the underside of the head 36. This will help secure the solar panel 50 into the assembly while minimizing the risk of damage to the solar panel 50. Using a leak resistant material, such as rubber, as this protective layer will also minimize leakage between the solar panel 50 and the head 36. Once installed, an additional sealing layer, such as silicone or some similar substance, may be applied to the junction 60 between the solar panel 50 and the head 36 to further minimize any potential invasion by water.

While FIG. 1 depicts the head 36 and foot 32 as being a roughly the same width, different widths may be used. For example, the foot 32 need be of sufficient width so as to be able to be positioned within the opening of the channel. A relatively wider head 36, however, may be desired to achieve greater contact with the solar panel 50 and a more secure installation.

Figure 2:
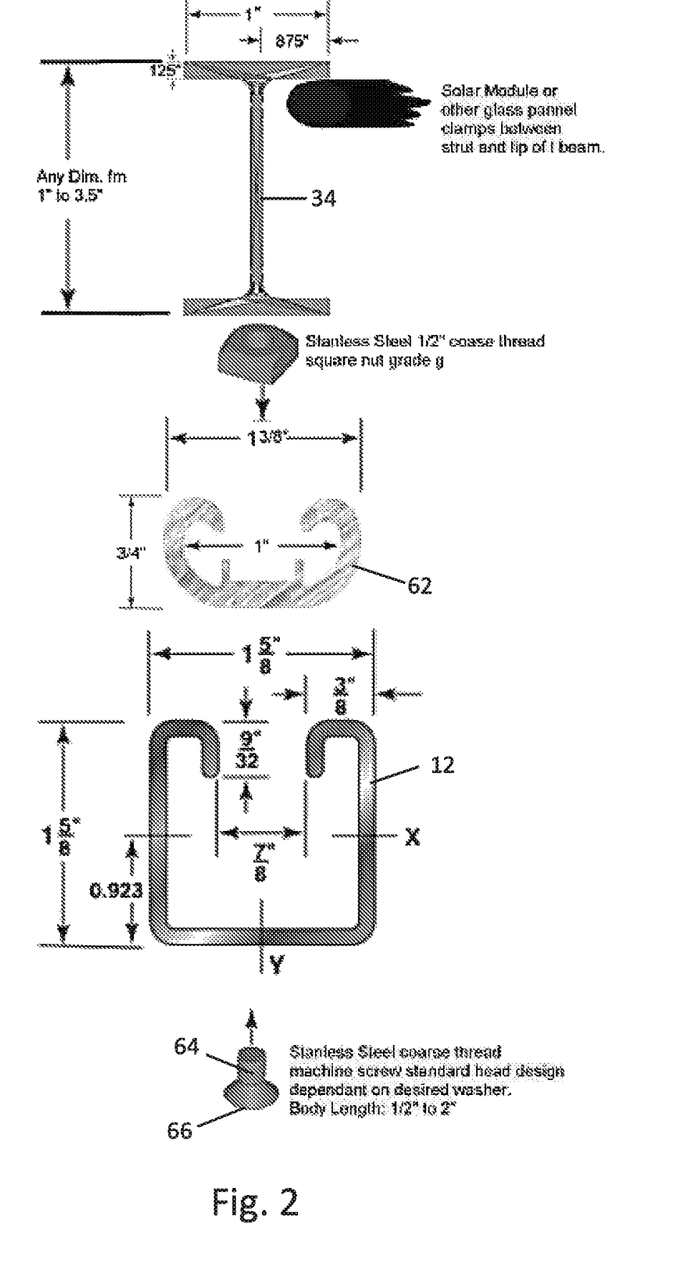
FIG. 2 depicts an exploded view of an embodiment of the solar panel assembly.

FIG. 2 shows an exploded view of the embodiment described above. Sample part dimensions are provided, though other dimensions may be used. FIG. 2 shows the rail 12 and I-beam 34. The parts making up the clamp 60 include the coupler 64 with integrated head 66, and the pair of retaining flanges 62. In the embodiment show, the coupler 64 is anchored into the pair of retaining flanges using a square nut that is set within a recess in the pair of retaining flanges 62 which prevents it from turning.

Figure 3:
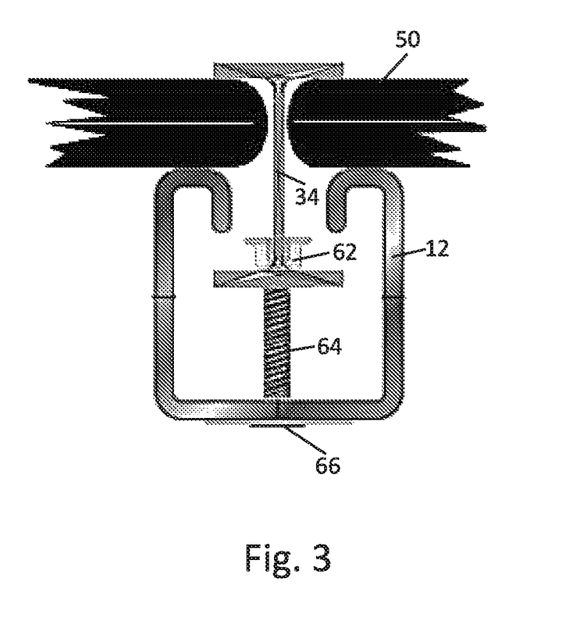
FIG. 3 depicts a cross-section view of an embodiment of the solar panel assembly.
Figure 4:
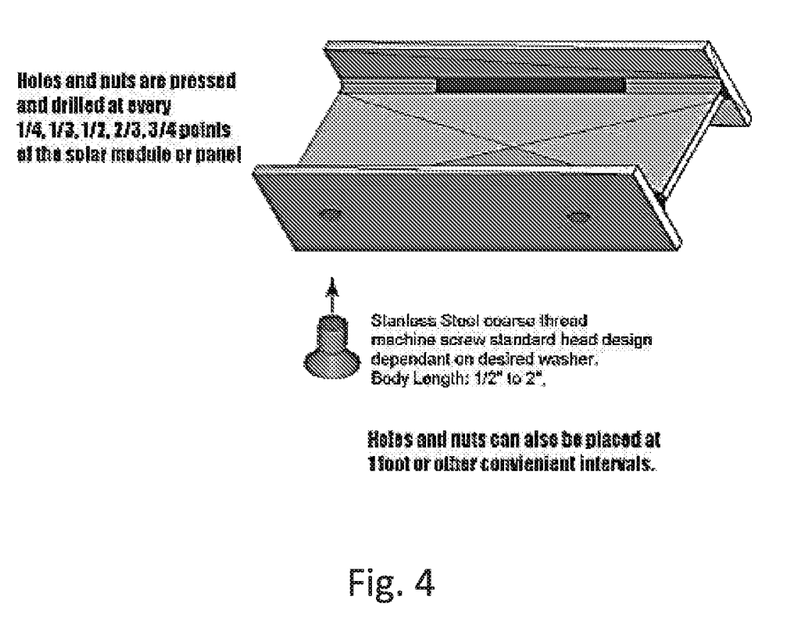
FIG. 4 depicts a prospective view an embodiment of the I-beam.
Figure 5:
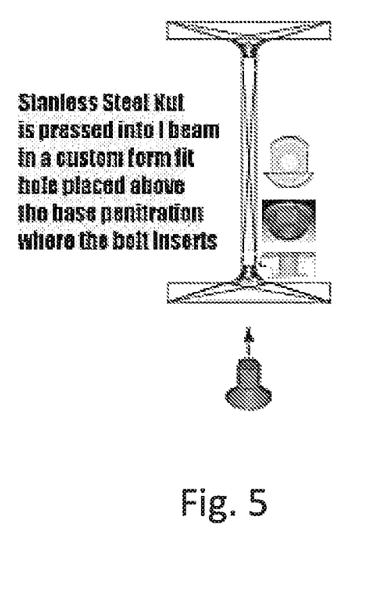
FIG. 5 is a cross sectional view of an embodiment of the I-beam.

FIG. 3 shows another embodiment of the solar panel assembly 10. In this embodiment, a nut with internal threading is pressed into a custom hole in the I-beam 34 and is aligned with a hole drilled into the foot of the I-beam. This nut functions as the pair of retaining flanges 62 and the coupler 64 with integrated adjuster 66 is inserted in to the hole in the I-beam and engages the nut such that the I-beam is drawn into the rail as the adjuster is turned. A detailed view of the construction of the I-beam holes and insertion of the nut is shown in FIGS. 4 and 5, respectively.

Figure 6:
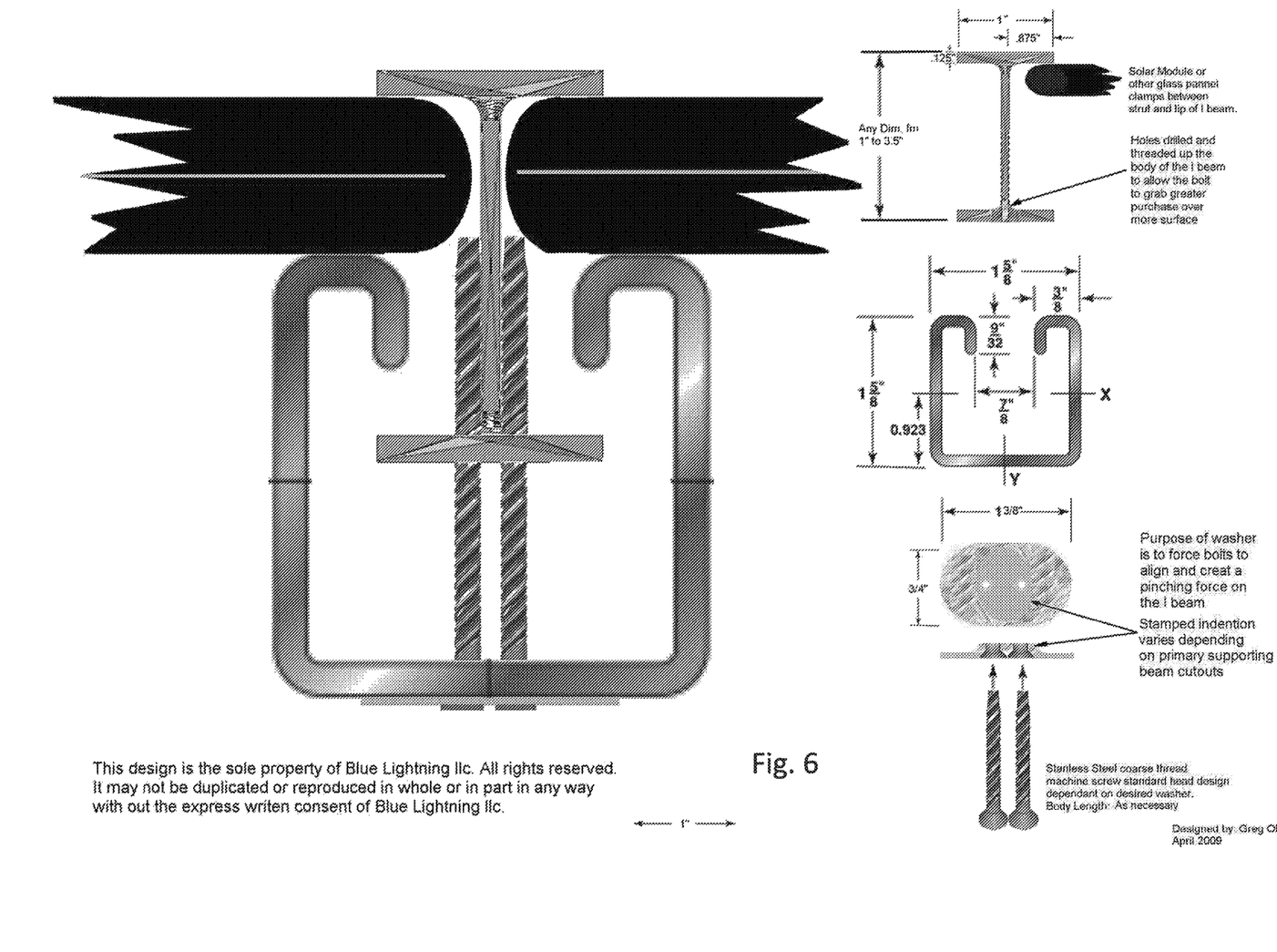
FIG. 6 depicts a cross sectional view and an exploded view of an embodiment of the solar panel assembly.
Figure 7:
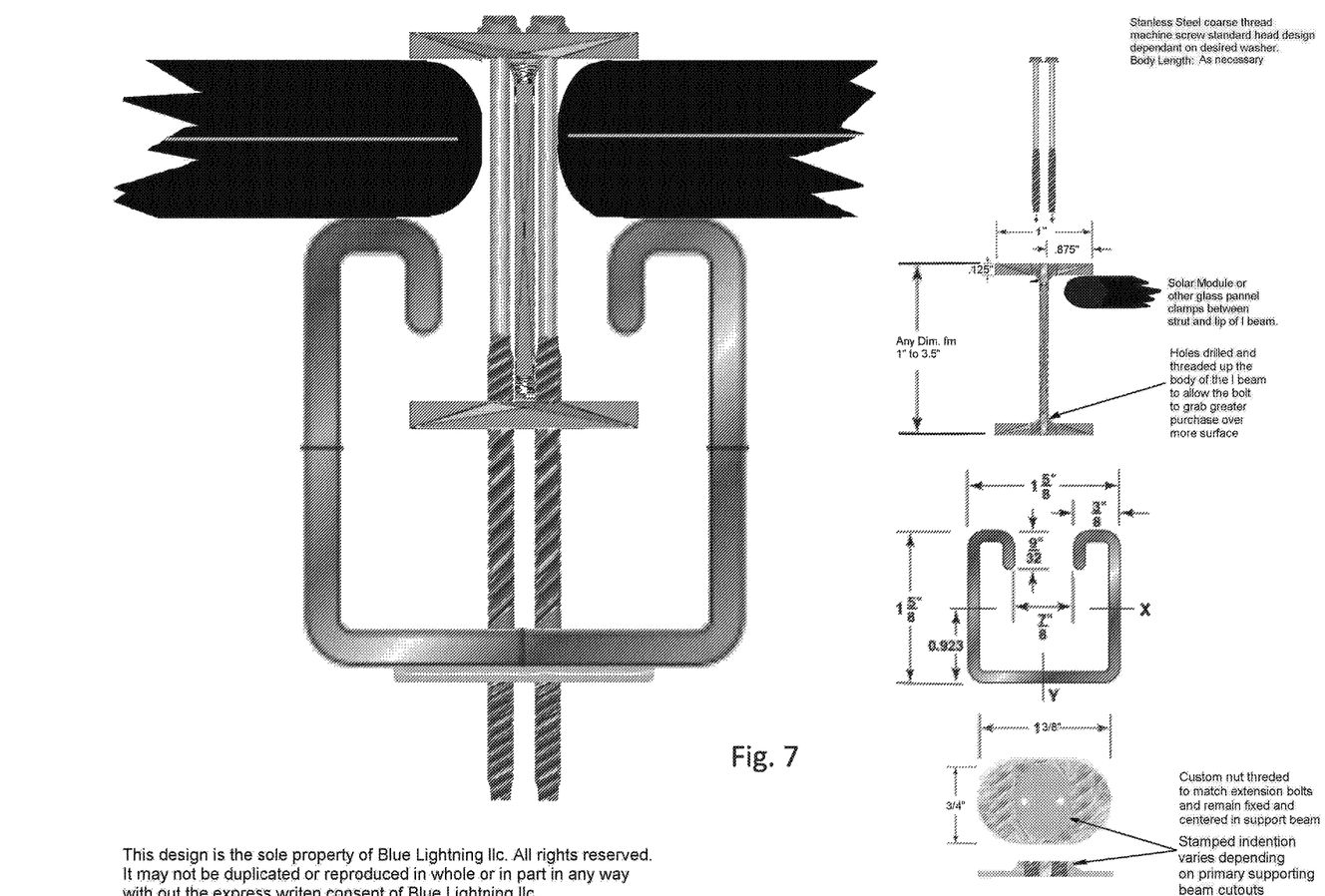
FIG. 7 depicts a cross sectional view and an exploded view of an embodiment of the solar panel assembly.

FIG. 6 shows an alternative embodiment of the solar panel assembly 10. In this embodiment there is an indentation and opening at the bottom of the U-bracket/rail base 14. A washer or bolt fits into this opening and has one or more holes to allow for the passage of one or more bolts or screws. Alternatively, the top of the I-beam can be configured to have one or more openings for passage of one or more bolts which pass through the I-beam to the washer, as shown in FIG. 7. The washer or bolt serves to align the connector bolts or screws that pass through the clamp and into the I-beam. The connector bolts can be made to insert on either side of the I-beam, with the I-beam externally threaded as shown in FIG. 6. Alternatively a single bolt can be utilized to pass through the center of the I-beam to connect the I-beam to the U-bracket. Tightening of the connector bolts or screws serves to draw the I-beam toward the bottom of the U-shaped connector, thus tightening the I-beam grip on the solar panels illustrated in each of the figures. Rubber or similar gaskets can be positioned between the I-beam flanges and the solar panel to provide a further weather resistant or weather tight junction.

Figure 8:
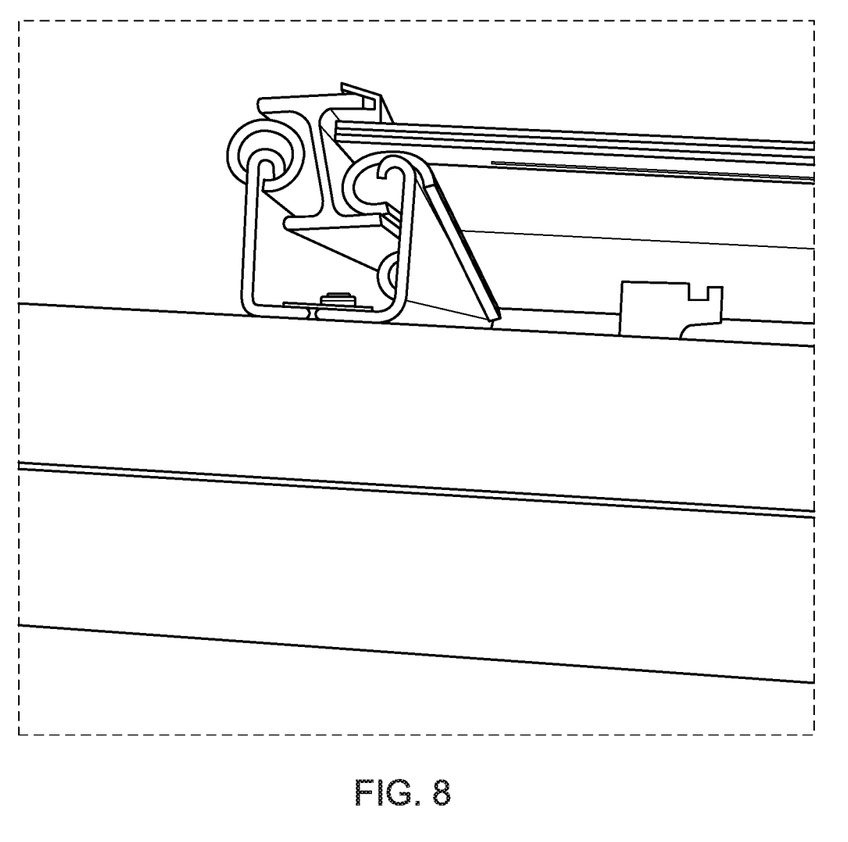
FIG. 8 depicts a side view of an embodiment of the solar panel assembly.
Figure 9:
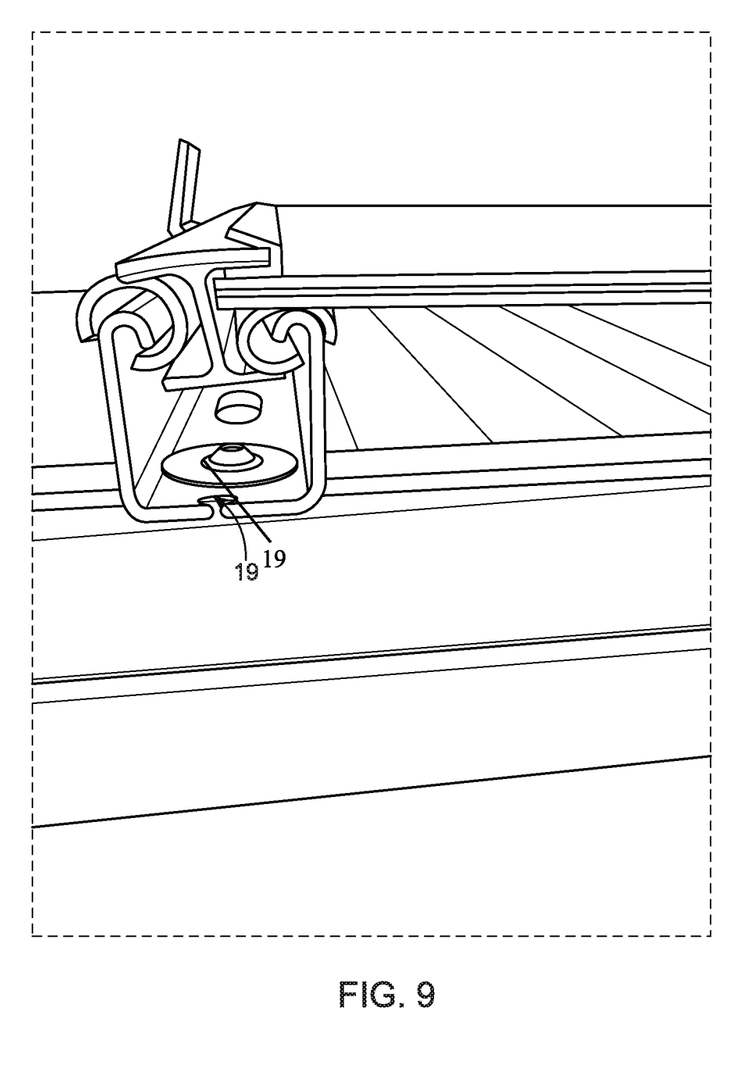
FIG. 9 depicts a side view of an embodiment of the solar panel assembly.

FIGS. 8 and 9 illustrate of an embodiment of the invention utilized to clamp an edge of the solar panel.

Figure 10:
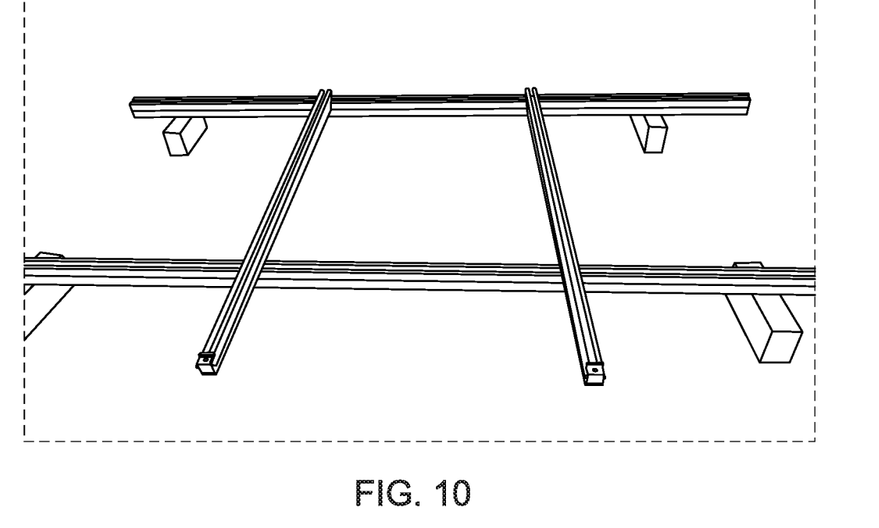
FIG. 10 depicts a top perspective view of an embodiment of the layout of the parallel tracks for the solar panel assembly.
Figure 11:
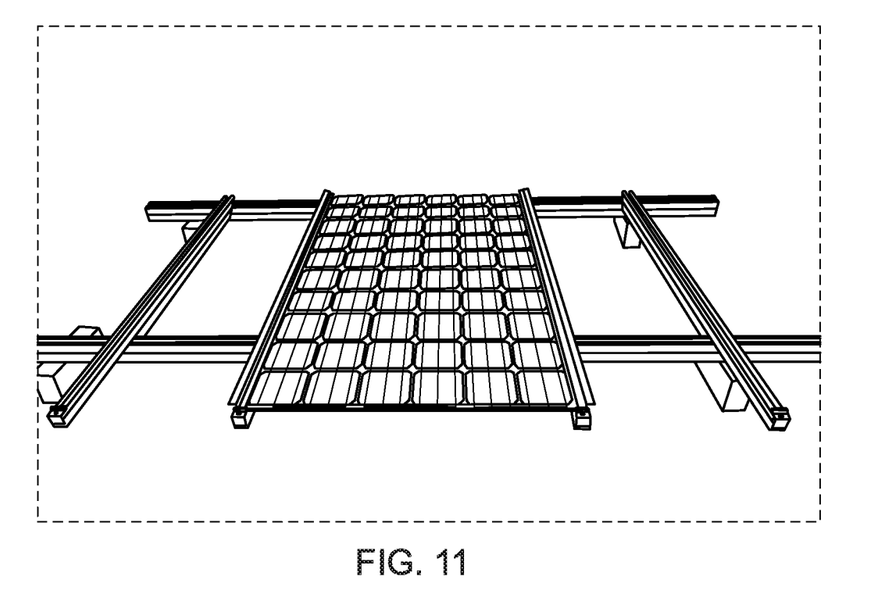
FIG. 11 depicts a top perspective view of an embodiment of the solar panel assembly.

FIG. 10 illustrates a layout of two parallel tracks for securing opposing edges of a solar panel. FIG. 11 illustrates two opposing parallel channels used to clamp opposing edges of a solar panel.

Figure 12:
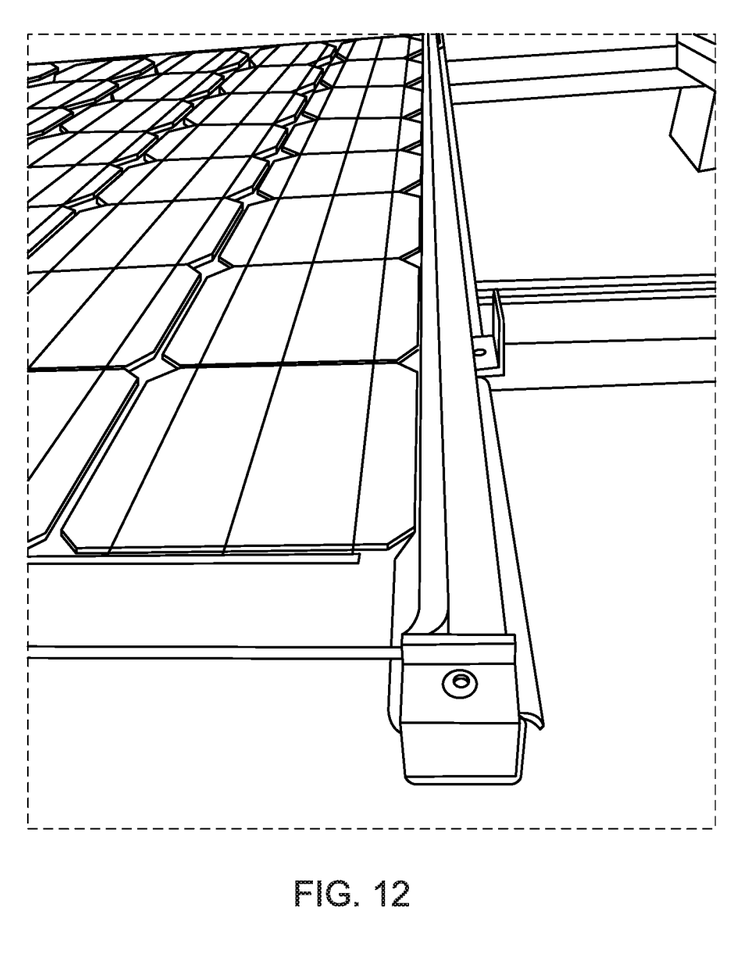
FIG. 12 depicts a top perspective view of the channel in an embodiment of the solar panel assembly.

FIG. 12 illustrates a top view of the channel in an embodiment of the invention.

While certain exemplary embodiments are shown in the s and described herein, it is to be distinctly understood that the presently disclosed inventive concept(s) is not limited thereto but may be variously embodied to practice within the scope of this disclosure. From the foregoing description, it will be apparent that various changes may be made without departing from the spirit and scope of the disclosure as defined herein.

I claim:

1. A solar panel assembly, for mounting solar panels, comprising:
a rail having a base and two walls, with said base having a first side and a second side, and one or more holes connecting said first side and said second side;
each of said walls having a base edge and a free edge, with each of said base edges attached to said first side of said base and each of said walls extending away from said base such that said walls oppose each other to form a channel, with the space between said free edges defining an opening into said channel;
an I-beam having a foot, a spine, and a head, with said foot and said head each defining a flat, elongated member, said foot and said head positioned parallel to each other and joined by perpendicular attachment of said spine;
said I-beam positioned within said rail such that said foot is situated within said channel and said spine extends through said opening of said channel with said head outside of said channel to define a gap between said free edges and said head, said gap capable of accommodating the thickness of a solar panel; and
a plurality of clamps, each clamp having a pair of retaining flanges, a coupler, and an adjuster, said pair of retaining flanges positioned inside said channel and configured to clasp said foot, with said coupler attached to said pair of retaining flanges and extending through one of said holes in said base, with said adjuster attached to said coupler and located outside said channel, said clamp configured such that manipulation of said adjuster changes the distance between said pair of retaining flanges and said adjuster;
wherein, when the edge of a solar panel is inserted into said gap, said adjuster may be manipulated so as to shorten the distance between said adjuster and said pair of retaining flanges, thereby pulling said I-beam further into said channel and reducing the size of said gap until the solar panel is securely held between said free edge and said head.

2. The solar panel assembly described in claim 1 further comprising a protective layer attached to said free edges and said head to minimize damage to solar panel during installation and adjustment.

3. The solar panel assembly described in claim 1 further comprising a sealing layer between said head and said solar panel to minimize leakage of fluid between said head and said solar panel.

4. A solar panel assembly, comprising:
a rail comprising a base and two walls, with said base having a first side and a second side, and one or more holes connecting said first side and said second side;

each of said walls having a base edge and a free edge, with each of said base edges attached to said first side of said base and each of said walls extending away from said base such that said walls oppose each other to form a channel, with the space between said free edges defining an opening into said channel;

an I-beam having a foot, a spine, and a head, with said foot and said head each defining a flat, elongated member, said foot and said head positioned parallel to each other and joined by perpendicular attachment of said spine;

said I-beam positioned within said rail such that said foot is situated within said channel and said spine extends through said opening of said channel with said head outside of said channel to define a gap between said free edges and said head, said gap capable of accommodating the thickness of a solar panel;

a plurality of clamps, each clamp having a pair of retaining flanges, a coupler, and an adjuster, said pair of retaining flanges positioned inside said channel and configured to clasp said foot, with said coupler attached to said pair of retaining flanges and extending through one of said holes in said base, with said adjuster attached to said coupler and located outside said channel, said clamp configured such that manipulation of said adjuster changes the distance between said pair of retaining flanges and said adjuster; and a solar panel having an edge inserted into said gap;

wherein, with said edge of said solar panel inserted into said gap, said adjuster may be manipulated so as to shorten the distance between said adjuster and said pair of retaining flanges, thereby pulling said I-beam further into said channel and reducing the size of said gap until the solar panel is securely held between said free edge and said spine side of said head.

5. A method of mounting solar panels, comprising:

providing a solar panel having one or more edges;

providing a rail comprising a base and two walls, with said base having a first side and a second side, and one or more holes connecting said first side and said second side;

each of said walls having a base edge and a free edge, with each of said base edges attached to said first side of said base and each of said walls extending away from said base such that said walls oppose each other to form a channel, with the space between said free edges defining an opening into said channel;

providing an I-beam having a foot, a spine, and a head, with said foot and said head each defining a flat, elongated member, said foot and said head positioned parallel to each other and joined by perpendicular attachment of said spine;

positioning said I-beam within said rail such that said foot is situated within said channel and said spine extends through said opening of said channel with said head outside of said channel to define a gap between said free edges and said head, said gap capable of accommodating the thickness of a solar panel; and providing a plurality of clamps, each clamp having a pair of retaining flanges, a coupler, and an adjuster, said pair of retaining flanges positioned inside said channel and configured to clasp said foot, with said coupler attached to said pair of retaining flanges and extending through one of said holes in said base, with said adjuster attached to said coupler and located outside said channel, said clamp configured such that manipulation of said adjuster changes the distance between said pair of retaining flanges and said adjuster;

inserting said edge of said solar panel into said gap and manipulating said adjuster so as to shorten the distance between said adjuster and said pair of retaining flanges, thereby pulling said I-beam further into said channel and reducing the size of said gap until the solar panel is securely held between said free edge and said spine side of said head.

\* \* \* \* \*